United States Patent [19]

Porambo et al.

[11] Patent Number: 5,280,638
[45] Date of Patent: Jan. 18, 1994

[54] RF FILTER SELF-ALIGNMENT FOR MULTIBAND RADIO RECEIVER

[75] Inventors: Sylvester P. Porambo, Canton; Robert D. Plowdrey, Belleville, both of Mich.

[73] Assignee: Ford Motor Company, Dearborn, Mich.

[21] Appl. No.: 756,255

[22] Filed: Sep. 6, 1991

[51] Int. Cl.$^5$ ............... H04B 17/02; H04B 1/16
[52] U.S. Cl. ............... 455/143; 455/144; 455/189.1; 455/340
[58] Field of Search ............... 455/142, 143, 144, 140, 455/180.1-3, 307, 181.1, 189.1, 190.1, 133, 191.3, 196.1, 192.2, 192.1, 197.1, 340

[56] References Cited

U.S. PATENT DOCUMENTS

| | | | |
|---|---|---|---|
| 3,839,678 | 10/1974 | Bell | 455/180.3 |
| 3,906,368 | 9/1975 | Eckenbrecht | |
| 4,070,628 | 1/1978 | Funabashi | 455/143 |
| 4,162,451 | 7/1979 | Ash | 455/180.2 |
| 4,232,398 | 11/1980 | Gould et al. | 455/226 |
| 4,334,323 | 6/1982 | Moore | 455/179 |
| 4,402,089 | 8/1983 | Knight et al. | 455/186 |
| 4,481,673 | 11/1984 | Muterspaugh | 455/180 |
| 4,590,611 | 5/1986 | Maier et al. | 455/166 |
| 4,685,150 | 8/1987 | Maier | 455/183 |
| 4,688,264 | 8/1987 | Miura | 455/144 |
| 4,736,456 | 4/1988 | Maier | 455/164 |
| 4,742,564 | 5/1988 | Dumont | 455/186 |
| 4,748,683 | 5/1988 | Sato | 455/164 |
| 4,760,535 | 7/1988 | Engimeier | 364/480 |
| 4,837,852 | 6/1989 | Takada et al. | 455/197 |
| 4,843,636 | 6/1989 | Hendriks et al. | 455/192 |
| 4,907,292 | 3/1990 | Leipert | 455/280 |
| 4,926,497 | 5/1990 | Shirley, Jr. et al. | 455/67 |

*Primary Examiner*—Reinhard J. Eisenzopf
*Assistant Examiner*—Lisa Charouel
*Attorney, Agent, or Firm*—Mark Mollon; Roger L. May

[57] ABSTRACT

A variable frequency RF passband filter is aligned or calibrated to maximize the sensitivity of a radio receiver using reference frequencies obtained using a fixed frequency oscillator present in a different band tuning section of a multiband receiver. The intermediate frequencies of the various band sections of the multiband receiver are selected whereby a fixed frequency source in one band corresponds to an intermediate frequency employed in the band for which the tunable RF filter is being aligned.

7 Claims, 2 Drawing Sheets

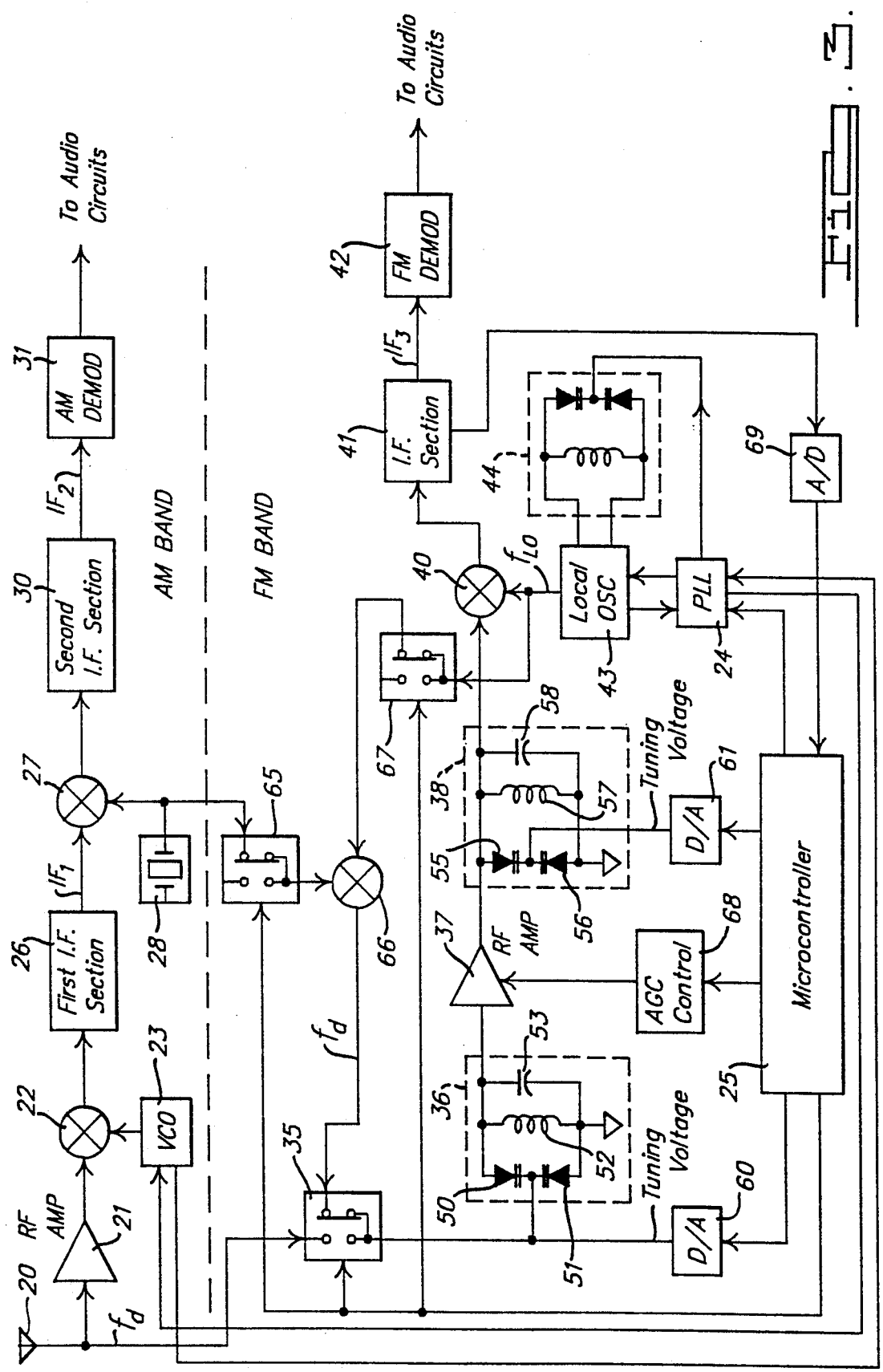

RF FILTER SELF-ALIGNMENT FOR MULTIBAND RADIO RECEIVER

BACKGROUND OF THE INVENTION

The present invention relates in general to aligning the frequency response of a variable bandpass filter in a radio receiver, and more specifically to obtaining a reference frequency in a multiband radio receiver for use in an alignment procedure for a variable bandpass filter.

Radio wave receivers (e.g., AM and FM radio, TV and mobile transceivers) simultaneously sense many different broadcast signals at their antennas. A desired signal must be separated from others in the broadcast band in order to present it to the user of a receiver. Each separate signal occupies a unique frequency range. Thus, a desired signal may, at least partially, be separated from other signals by connecting an antenna to a bandpass filter which attenuates all frequencies other than those in the desired frequency range. In order to selectively receive different frequency ranges (i.e., stations or channels), the bandpass filter comprises a variable radio-frequency (RF) filter. One such variable filter includes voltage variable capacitors known as varactor diodes, as well as fixed capacitors and fixed inductors in a bandpass configuration wherein a voltage applied to the varactor diodes controls the resonant frequency (i.e., center frequency) of the filter. When tuning in a radio-wave broadcast signal at a particular carrier frequency, a control voltage applied to the varactors causes the center resonant frequency of the RF filter to coincide with that carrier frequency. Radio-wave signals outside the passband of the RF filter are attenuated, thus improving the selectivity of the receiver. However, the width of the passband of a particular RF filter is greater than the bandwidth of a particular broadcast signal so that the RF filter output may include several broadcast signals. Further selection of the desired broadcast signal is performed in an intermediate frequency section of the receiver as is known in the art.

Due to variability of characteristics of individual capacitors, inductors, and varactors used in constructing a tunable RF filter, the filter response must be aligned (i.e., calibrated by frequency) for each individual receiver. In order to find the precise control voltage to be applied to a varactor in a filter to obtain the desired frequency response, a known reference frequency is typically applied to the input of the variable filter during the alignment procedure. The filter control voltage is then varied throughout its range in order to maximize the magnitude of the filter output. At maximum output, the frequency response of the variable filter is assumed to be properly aligned. Since the relationship of the filter control voltage to the filter center frequency is not linear, the variable RF filter must be aligned for at least two frequencies in order to adequately determine that relationship. Thus, at least two reference frequencies are needed (e.g., the lowest and highest frequencies in a desired broadcast band).

Alignment is preferably done automatically without use of external devices in order to save manufacturing time, labor, and cost. Prior art receivers with automatic alignment have obtained a reference frequency from either a variable oscillator already present in the radio receiver or an auxiliary source dedicated to providing the reference frequency.

The use of extra hardware is undesirable, especially at higher frequencies, such as within the FM band, television band, and mobile communication band because of high cost. On the other hand, if the variable oscillator present in the superheterodyne tuner is used to provide the reference frequencies, then the oscillator is not available to perform its usual task of mixing the radio-frequency signal (reference signal) to a lower intermediate frequency. As a result, the magnitude of the filter output must be measured and maximized at the RF frequencies rather than at the intermediate frequencies. Thus, circuits normally already present for measuring the strength of intermediate-frequency signals cannot be used. Furthermore, detection of the level of an RF signal can only be done inaccurately and subject to many errors unless expensive and complicated extra hardware is employed.

In commonly assigned and co-pending application Ser. No. 582,579 entitled "RF FILTER ALIGNMENT USING DIGITAL PROCESSOR CLOCK", filed Sept. 14, 1990, now U.S. Pat. No. 5,101,509 issued Mar. 31, 1992 reference RF frequencies are provided by the clock signal of a digital processor. Several reference frequencies within a receiving band of a receiver are obtained from the clock signal by employing harmonic frequencies. However, alignment is not possible at reference frequencies between harmonic frequencies. Furthermore, if the difference between the fundamental clock frequency and the receiving band of the receiver is too great, then the magnitude of the harmonic frequencies from the clock signal may be inadequate to provide a reference frequency within the receiving band.

SUMMARY OF THE INVENTION

It is a principal object of the present invention to provide method and apparatus for automatically aligning an RF filter using few additional components.

The present invention is particularly adapted to a multiband radio receiver, such as, a radio receiver adapted to receive broadcasts in both the AM and the FM bands. Thus, a frequency supply of one tuner can be employed as a frequency reference in an alignment procedure of the other tuner. In one embodiment, the present invention comprises a double conversion tuner for a first band including a variable oscillator generating a first oscillator signal and a fixed oscillator generating a second oscillator signal. A second tuner for a second band includes a tunable RF filter, a variable oscillator generating a third oscillator signal, and a mixer receiving the third oscillator signal to produce an IF signal. An auxiliary mixer is coupled to the double conversion tuner and the second tuner to generate a reference signal in accordance with the second and third oscillator signals. The frequency of the second oscillator signal is chosen to be substantially equal with the frequency of the IF signal in the second tuner whereby an exact reference frequency can automatically be generated in response to the normal tuning commands of the second tuner.

BRIEF DESCRIPTION OF THE DRAWINGS

The novel features of the invention are set forth with particularity in the appended claims. The invention itself, however, both as to its organization and method of operation together with further objects and advan

FIG. 3 is a block diagram showing a preferred embodiment of a receiver according to the present invention.

DETAILED DESCRIPTION OF PREFERRED EMBODIMENTS

Figure 1:
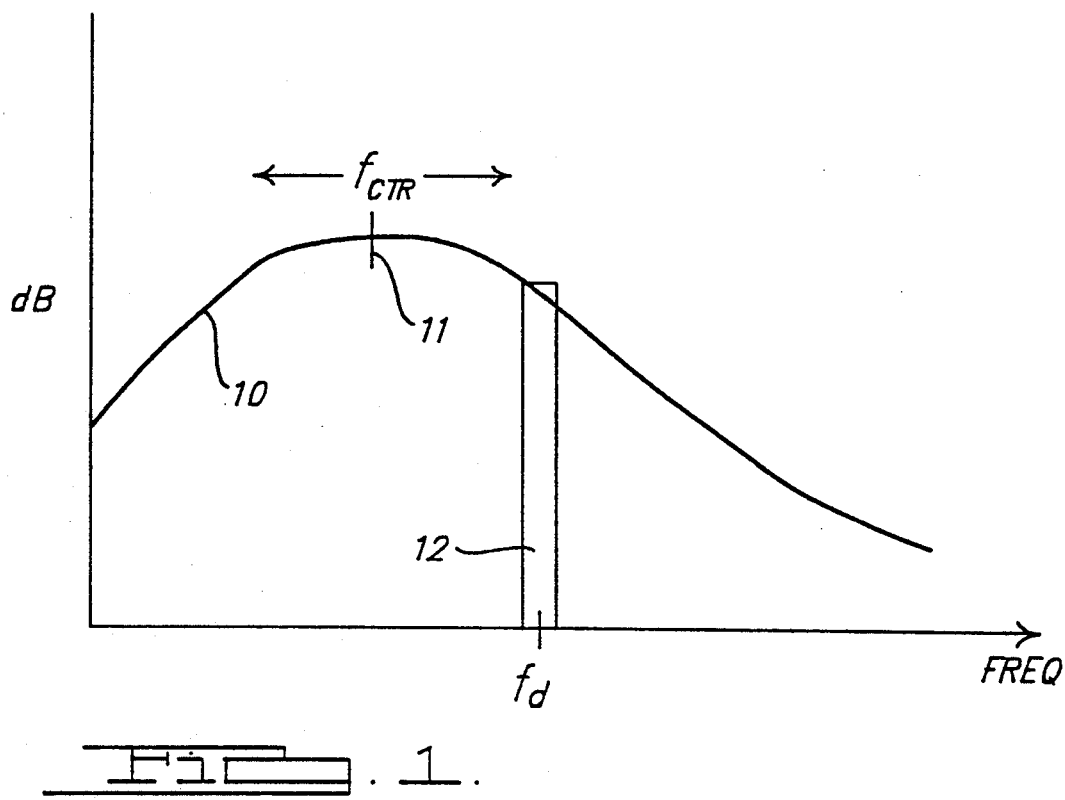
- FIG. 1 is plot showing misalignment between an RF filter passband and a desired broadcast signal.

FIG. 1 shows a frequency response 10 of a tunable RF filter which includes a center frequency 11 denoted $f_{CTR}$. A broadcast signal to be received from a desired station occupies a frequency range 12 which in most commercial transmissions is centered on a desired carrier frequency $f_d$. In order to maximize the signal available to the receiver, center frequency $f_{CTR}$ should be aligned to fall at the center of frequency range 12.

Figure 2:
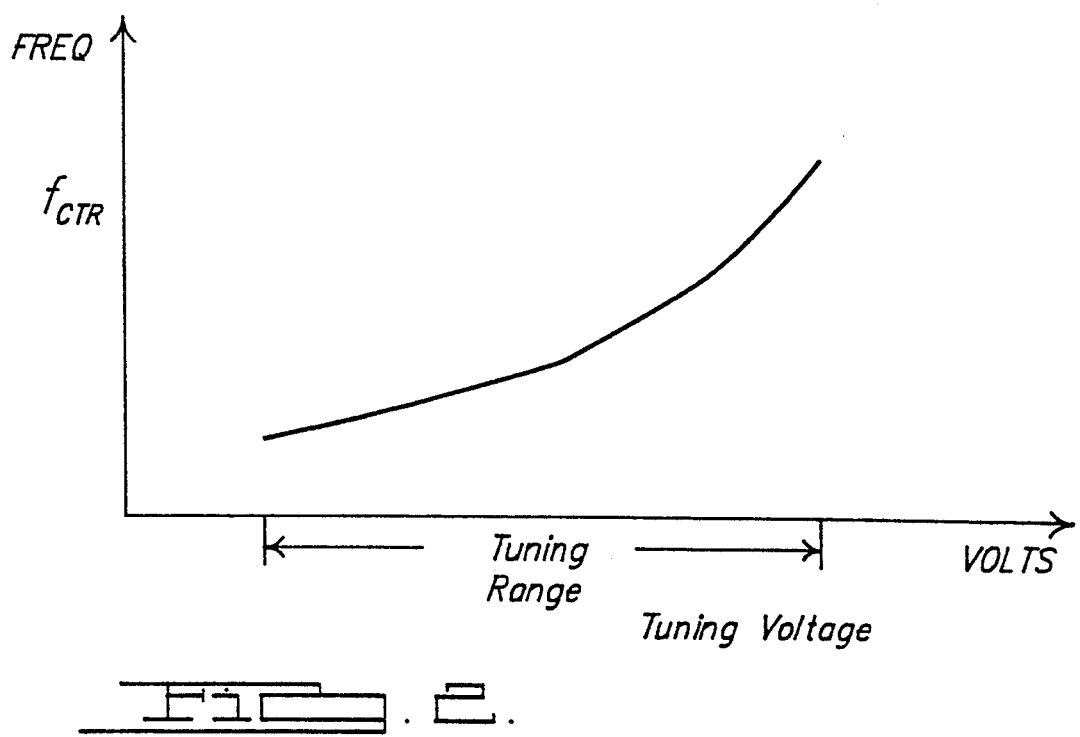
FIG. 2 is a plot of a filter tuning control voltage versus the center resonant frequency of the filter.

As shown in FIG. 2, alignment of the filter response is achieved by setting the tuning voltage to a DC voltage which will cause center frequency $f_{CTR}$ to coincide with desired frequency $f_d$. However, due to the variability from one component part to another and changes in components over time, the exact parameters of the control curve shown in FIG. 2 are not known in advance for an individual filter at any particular time. The alignment process determines the proper tuning voltage which corresponds to each desired frequency to be received or to preselected frequencies within a band from which other values may be interpolated.

FIG. 3 illustrates a preferred embodiment of the present invention including automatic calibration of the filter tuning voltage. An antenna 20 receives AM and-/or FM broadcast signals. When receiving in the AM band, AM broadcast signals are coupled to the input of an AM RF amplifier 21 having its output connected to one input of a mixer 22. The other input of mixer 22 is connected to an output of a voltage controlled oscillator (VCO) 23 which is connected to a phase-locked loop (PLL) 24 which is in turn controlled by a microcontroller 25 to provide a mixing signal to generate a first intermediate frequency in the AM tuner. The output of mixer 22 is connected to a first IF section 26 which provides a band limited and amplified intermediate frequency signal $IF_1$. A second mixer 27 receives intermediate-frequency signal $IF_1$ at one input and receives a fixed oscillator signal at its other input from a fixed oscillator 28, preferably a crystal oscillator. The output of mixer 27 is connected to a second IF section 30 which provides a band limited and amplified intermediate-frequency signal $IF_2$ to an AM demodulator 31. Demodulated AM signals are provided to audio circuits (not shown).

The AM tuner shown in FIG. 3 is known as a double conversion receiver. In single conversion receivers with only one intermediate frequency, the choice of a frequency for the intermediate frequency involves a trade-off since a lower IF has advantages of better selectivity, better stability, and higher gain while a higher IF has the advantage of better image rejection as is known in the art. A double conversion tuner achieves the benefits of both a high and a low IF by employing a high first IF and then converting to a low second IF. Thus, an incoming RF signal in the AM band (530 KHz to 1710 KHz) is up-converted in mixer 22 to a first intermediate frequency $IF_1$. Fixed crystal oscillator 28 is used to down-convert the first intermediate frequency to an intermediate frequency $IF_2$ which is lower than $IF_1$.

In the preferred embodiment of the invention, this same fixed oscillator 28 is used to form RF reference signals for dynamic self-alignment of the FM tuner. The several reference frequencies to be used in a self-alignment procedure are generated by an auxiliary mixer which mixes the fixed oscillator signal with a variable oscillator signal from the FM tuner. In order to also allow the variable oscillator in the FM tuner to be simultaneously used to generate an FM IF signal, the frequency of the fixed oscillator 28 (i.e., the difference in frequency between $IF_1$ and $IF_2$ in the AM section) is chosen to be substantially equal to the FM intermediate frequency.

In an FM section of the receiver shown in FIG. 3, a relay-type switch 35 (preferably comprised of solid-state switches) is connected to antenna 20 and normally provides an antenna signal at its output signal to the input of a tunable RF filter 36. A filtered RF signal is amplified by RF amplifier 37 and again filtered by a second tunable RF filter 38. The twice filtered RF signal is down-converted in a mixer 40 to a FM IF signal which is provided to an IF section 41 for amplification and selection. The resulting intermediate-signal signal is coupled to an FM demodulator 42 which provides a baseband audio signal to audio circuits (not shown). The mixing signal for mixer 40 is provided by a VCO comprised of a local oscillator 43 and a variable resonant circuit 44 which are connected with PLL 24.

Tunable RF filters 36 and 38 take a form known in the art including a pair of varactor diodes connected in parallel with an inductor and a capacitor. Thus, RF filter 36 receives an input RF signal at the junction between the cathodes of a varactor 50 and a varactor 51. An inductor 52 and a capacitor 53 are connected between the anodes of varactors 50 and 51. The anode of varactor 51 is connected to ground while the anode of varactor 50 is connected to the filter output. Tunable RF filter 36 also acts as a capacitive transformer and additionally provides impedance matching between antenna 20 and RF amplifier 37.

Tunable RF filter 38 includes a pair of varactor diodes 55 and 56 having their cathodes connected together and having an inductor 57 and a capacitor 58 connected in parallel therewith. However, in RF filter 38 the input is directly connected to the output.

RF filters 36 and 38 may also include circuit means (not shown) for providing temperature compensation to counteract temperature changes in the varactor diodes, as is known in the art.

RF filters 36 and 38 function as bandpass filters having a predetermined frequency width and having a center frequency controlled by the DC tuning voltage present at the cathodes of varactor pairs 50 and 51 and 55 and 56, i.e., the tuning voltages provided by a digital-to-analog (D/A) converter 60 and a D/A converter 61, respectively Microcontroller 25 provides digital values to D/A converters 60 and 61 for controlling the respective center frequencies of the RF filters. D/A converters 60 and 61 may preferably convert a six-bit digital signal to an analog voltage within a predetermined range of DC voltage. In a preferred embodiment, a voltage range between about 6 and 8 volts may be employed. The six-bit resolution of the D/A converter provides 64 steps and each step represents a voltage change of about 125 millivolts. Thus, microcontroller 25 is required to output a digital value which is associated with the desired center frequency of the respective tunable RF filters.

In order to perform alignment of the digital values associated by microcontroller 25 with the desired center frequencies to be obtained by tunable RF filters 36 and 38, alignment apparatus are provided including a relay-type switch 65, an auxiliary mixer 66, and a relay-type switch 67. Relay-type switches 35, 65 and 67 receive a switch control signal from microcontroller 25. Switch 65 selectively couples the fixed frequency signal from fixed crystal oscillator 28 to one input of mixer 66. Switch 67 selectively couples the output of local oscillator 43 (i.e., a variable oscillator signal corresponding to the desired FM signal to be received) to the second input of auxiliary mixer 66. The output of auxiliary mixer 66 is selectively coupled to the input of tunable RF filter 36 through switch 35.

The alignment apparatus further includes an automatic gain control (AGC) circuit 68 connected to microcontroller 25 and RF amplifier 37, and an analog-to-digital (A/D) converter 69 connected to microcontroller 25 and IF section 41. In operation, when it is desired to receive a selected FM broadcast signal, PLL 24 is commanded to produce a frequency output $F_{LO}$ from local oscillator 43 corresponding to the center frequency of the desired FM signal $f_d$ plus the intermediate frequency $IF_3$ of the FM tuner. Thus, when the desired signal at desired frequency $f_d$ is mixed with local oscillator frequency $f_{LO}$ in mixer 40, the proper intermediate frequency $IF_3$ is generated. In order to provide the proper reference frequency for alignment of the tunable RF filters, the local oscillator output $f_{LO}$ is coupled through switch 67 to mixer 66. Since frequency $f_{LO}$ is separated from the desired frequency $f_d$ by exactly the intermediate frequency of the FM receiver, the desired frequency $f_d$ is obtained by mixing the local oscillator signal $f_{LO}$ with the fixed frequency output of crystal oscillator 28 which is selected according to the present invention to have an output frequency substantially equal to intermediate frequency $IF_3$.

By way of example, the various frequencies could be selected such that $IF_1$ equals 11.155 MHz, $IF_2$ equals 455 KHz, and $IF_3$ equals 10.7 MHz. Thus, the second intermediate frequency in the AM section and the intermediate frequency in the FM section both correspond to their conventional values, thus allowing standard components to be utilized in the receiver Furthermore, a fixed oscillator operating at 10.7 MHz is easily obtainable.

Alternatively, it may be desirable to maintain a slight inequality between the frequency of the fixed oscillator and the intermediate frequency of the FM tuner. In a second example, the frequencies of $IF_1$ and $IF_3$ both are selected to equal 10.7 MHz in order to allow use of standard components. A very low second intermediate frequency $IF_2$ of 47.5 KHz is selected (e.g., for purposes of facilitating analog-to-digital conversion of the AM signal in a digital receiver), resulting in a fixed oscillator frequency of 10.7475 MHz. Since the inequality between $IF_3$ and the fixed oscillator frequency is small, alignment can still be accomplished by compensating for the inequality. Compensation can be obtained by offsetting the commanded local oscillator frequency $f_{LO}$ so that the proper desired frequency $f_d$ is still generated by the auxiliary mixer. The FM tuner will then generate an offset intermediate frequency signal, but a small offset will not affect the signal strength measurements. Rather than offset $f_{LO}$, compensation could alternatively be obtained by adding a predetermined correction factor to the digital values determined for the tuning voltages.

The alignment procedure proceeds as follows. After setting switches 35, 65, and 67 in the positions shown in FIG. 3 to provide for reference signals at desired frequency $f_d$, microcontroller 25 selects initial tuning voltages for tunable RF filters 36 and 38 and institutes an alignment procedure for maximizing the outputs of the filters. Throughout the alignment procedure, an AGC control signal from AGC circuit 68 to RF amplifier 37 is held fixed by microcontroller 25. A signal strength output from IF section 41 is converted to a digital value in A/D converter 69 to be monitored by microcontroller 25 in order to maximize such value.

By virtue of the fixed frequency available from fixed oscillator 28, the output of local oscillator 43 is used to generate both the reference frequency $f_d$ through mixer 66 and the normal intermediate-frequency signal through mixer 40, thus allowing the signal strength circuits present in IF section 41 to be utilized in the alignment procedure.

Alignment of tunable RF filters 36 and 38 are conducted one at a time. For example, the signal strength output from IF section 41 may be first maximized while varying the tuning voltage provided to RF filter 36 and then maximized again by varying the tuning voltage of RF filter 38. Due to interactions between the two RF filters, it is preferable to repeat the alignments a second time.

After collecting the signal strength value at a particular tuning voltage, microcontroller 25 steps to a new tuning voltage and compares the signal strength value obtained at that tuning voltage with signal strength values obtained at previous tuning voltages. In a preferred search method, the tuning voltage is scanned or stepped in a first direction until the signal strength value decreases from one step to the next by at least a predetermined value. Next, stepping of the tuning voltage is conducted in the opposite direction until a similar decrease occurs. Finally, the tuning voltage is selected that corresponded with the maximum signal strength value during the stepping in the opposite direction.

The alignment process may be performed each time a new FM channel is tuned-in. However, the alignment is preferably performed at one time for a number of FM channels so that the center frequency versus DC voltage curve shown in FIG. 2 can be determined and stored for use during tuning of FM broadcast signals. The alignment process may be repeated periodically in order to account for any changes in filter characteristics. Thus, the alignment process may be performed each time battery power is connected to the receiver or the alignment process may be accessed through a control menu of the receiver.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A multiband radio receiver comprising:

a double conversion tuner for a first band including a variable oscillator generating a first oscillator signal which is coupled to a first mixer for producing a first intermediate frequency signal, and a fixed oscillator generating a second oscillator signal which is coupled to a second mixer for producing a second intermediate frequency signal;

a second tuner for a second band including a tunable RF filter, a variable oscillator generating a third oscillator signal, and a mixer receiving said third oscillator signal to produce a third intermediate frequency signal, said third intermediate frequency signal being at a frequency substantially equal to the frequency of said second oscillator signal; and an auxiliary mixer coupled to said double conversion tuner and said second tuner to generate a reference signal in accordance with said second and third oscillator signals.

2. The receiver of claim 1 further comprising control means coupled to said double conversion tuner, said second tuner, and said auxiliary mixer for selectably coupling said reference signal to said tunable RF filter and for retuning said tunable RF filter to maximize said third intermediate frequency signal produced in said second tuner by mixing said reference signal and said third oscillator signal in said mixer of said second tuner.

3. The receiver of claim 2 further comprising a signal strength detector receiving said third intermediate frequency signal and providing a strength indicating signal to said control means.

4. The receiver of claim 3 wherein said control means retunes said tunable RF filter to a plurality of settings, samples said strength indicating signal at each of said settings, and selects a final tuning of said tunable RF filter at the setting corresponding to the maximum sampled magnitude of said strength indicating signal.

5. The receiver of claim 2 further comprising:
an antenna; and
switch means coupled to said antenna, said auxiliary mixer, said tunable RF filter, and said control means for selectably coupling either said antenna or said auxiliary mixer with said tunable RF filter in response to said control means.

6. A method of aligning a tunable RF filter in a multiband radio receiver comprising the steps of:
providing a double conversion tuner for at least one band of said multiband radio receiver, said double conversion tuner having a first IF signal at a first IF frequency and a second IF signal at a second IF frequency and having a fixed oscillator producing a fixed frequency signal for mixing with said first IF signal to generate said second IF signal;

providing a second tuner for another band of said multiband radio receiver, said second tuner having said tunable RF filter for receiving signals of said another band, a variable oscillator generating a variable frequency signal, and a mixer for producing a third IF signal at a third IF frequency;

selecting said first, second, and third IF frequencies so that said third IF frequency substantially coincides with the frequency of said fixed frequency signal;

mixing said fixed frequency signal and said variable frequency signal to generate a reference signal;

coupling said reference signal to said tunable RF filter; and retuning said tunable RF filter to maximize the magnitude of said third IF signal.

7. The method of claim 6 wherein said third IF frequency is substantially equal to a difference between said first IF frequency and said second IF frequency.

* * * * *